United States Patent [19]

Pasch

[11] Patent Number: 5,225,358
[45] Date of Patent: Jul. 6, 1993

[54] METHOD OF FORMING LATE ISOLATION WITH POLISHING

[75] Inventor: Nicholas F. Pasch, Pacifica, Calif.

[73] Assignee: LSI Logic Corporation, Milpitas, Calif.

[21] Appl. No.: 749,257

[22] Filed: Aug. 23, 1991

Related U.S. Application Data

[63] Continuation-in-part of Ser. No. 711,624, Jun. 6, 1991, which is a continuation-in-part of Ser. No. 748,853, Aug. 22, 1991.

[51] Int. Cl.[5] .................................. H01L 21/265
[52] U.S. Cl. .................................. 437/33; 437/67; 437/72; 437/235; 437/236; 148/DIG. 86
[58] Field of Search ............... 437/67, 69, 213, 72, 437/228, 235, 236; 148/DIG. 85, DIG. 86

[56] References Cited

U.S. PATENT DOCUMENTS

| | | | |
|---|---|---|---|
| Re. 32,207 | 7/1986 | Levinstein et al. | 427/85 |
| 3,479,237 | 4/1966 | Bergh et al. | 156/11 |
| 4,019,248 | 4/1977 | Black | 437/67 |
| 4,038,110 | 7/1977 | Feng | 148/187 |
| 4,256,534 | 3/1981 | Levinstein et al. | 156/643 |
| 4,276,557 | 6/1981 | Levinstein et al. | 357/67 |
| 4,470,874 | 9/1984 | Bartush et al. | 156/643 |
| 4,484,979 | 11/1984 | Stocker | 156/643 |
| 4,490,209 | 12/1984 | Hartman | 156/643 |
| 4,493,142 | 1/1985 | Hwang | 29/575 |
| 4,508,815 | 4/1985 | Ackmann et al. | 430/314 |
| 4,520,041 | 5/1985 | Aoyama et al. | 427/88 |
| 4,541,168 | 9/1985 | Galie et al. | 29/579 |
| 4,545,852 | 10/1985 | Barton | 156/643 |
| 4,609,809 | 9/1986 | Yamaguchi et al. | 219/121 |
| 4,666,553 | 5/1987 | Blumenfeld et al. | 156/643 |
| 4,671,851 | 6/1987 | Beyer et al. | 156/645 |
| 4,708,770 | 11/1987 | Pasch | 156/662 |
| 4,758,306 | 7/1988 | Cronin et al. | 156/643 |
| 4,775,550 | 10/1988 | Chu et al. | 427/38 |
| 4,789,648 | 12/1988 | Chow et al. | 437/225 |
| 4,851,097 | 7/1989 | Hattori et al. | 204/192.33 |
| 4,876,217 | 10/1989 | Zdebel | 437/67 |
| 4,876,223 | 10/1989 | Yoda et al. | 437/228 |
| 4,879,257 | 11/1989 | Patrick | 437/195 |
| 4,879,258 | 11/1989 | Fisher | 437/225 |
| 4,892,614 | 1/1990 | Chapman et al. | 156/643 |
| 4,892,845 | 1/1990 | Bridges | 437/195 |
| 4,894,351 | 1/1990 | Batty | 437/190 |
| 4,897,150 | 1/1990 | Dooley et al. | 156/628 |

(List continued on next page.)

FOREIGN PATENT DOCUMENTS

| | | |
|---|---|---|
| 0223920 | of 0000 | European Pat. Off. . |
| 0224013 | of 0000 | European Pat. Off. . |
| 58-153351 | of 0000 | Japan . |
| 60-260455 | 11/1987 | Japan . |
| 89/02929 | of 0000 | PCT Int'l Appl. . |
| 2186424A | of 0000 | United Kingdom . |

OTHER PUBLICATIONS

*Thin Film Processes*, by Vossen et al., pp. 497-521, 1978.
*Chemical Vapor Deposited Device Isolation with Chemical/Mechanical Planarization*, 1986, IBM Technical Disclosure Bulletin (TDB), vol. 29, No. 2, pp. 577-579.
*Glass Planarization by Stop-Layer Polishing*, Beyer, Mendel, Plikin, Riseman, 1985, IBM TDB, vol. 27 No. 8, pp. 4700-4701, pp. 577-579.
*Trench Planarization Technique*, C. W. Koburger, 1984, IBM (TDB), vol. 27 No. 6, pp. 3242-32433.

Primary Examiner—Brian E. Hearn
Assistant Examiner—Tuan Nguyen
Attorney, Agent, or Firm—Gerald E. Linden; Michael D. Rostokes

[57] ABSTRACT

Isolation and passivation structures are formed in a single step, after transistor fabrication, by CVD deposition of a layer of oxide or BPSG over the wafer. The passivation/isolation layer overfills trenches formed for isolation and covers the patterned transistor device The layer is subsequently planarized by chem-mech polishing. With only one deposition step involved, to form both isolation structures and a passivation layer, there is significantly less strain on the thermal budget. Process and product by process are disclosed.

4 Claims, 2 Drawing Sheets

U.S. PATENT DOCUMENTS

| | | | |
|---|---|---|---|
| 4,897,364 | 1/1990 | Nguyen et al. | 437/69 |
| 4,897,365 | 1/1990 | Baldi et al. | 437/69 |
| 4,898,841 | 2/1990 | Ho | 437/200 |
| 4,900,689 | 2/1990 | Bajor et al. | 437/31 |
| 4,901,132 | 2/1990 | Kuwano | 357/43 |
| 4,902,641 | 2/1990 | Koury, Jr. | 437/62 |
| 4,903,109 | 2/1990 | Kooi | 357/50 |
| 4,903,112 | 2/1990 | Strack et al. | 357/55 |
| 4,905,062 | 2/1990 | Esquivel et al. | 357/23.5 |
| 4,905,073 | 2/1990 | Chen et al. | 357/67 |
| 4,906,592 | 3/1990 | Merenda et al. | 437/190 |
| 4,906,593 | 3/1990 | Shioya et al. | 437/192 |
| 4,906,595 | 3/1990 | van der Plas et al. | 437/239 |
| 4,907,063 | 3/1990 | Okada et al. | 357/54 |
| 4,907,066 | 3/1990 | Thomas et al. | 357/71 |
| 4,908,683 | 3/1990 | Matlock et al. | 357/23.11 |
| 4,910,155 | 3/1990 | Cote et al. | 437/8 |
| 4,910,168 | 3/1990 | Tsai | 437/51 |
| 4,912,062 | 3/1990 | Verma | 437/69 |
| 4,914,056 | 4/1990 | Okumura | 437/192 |
| 4,916,087 | 4/1990 | Tateoka et al. | 437/67 |
| 4,916,494 | 4/1990 | Flohrs et al. | 357/13 |
| 4,916,514 | 4/1990 | Nowak | 357/68 |
| 4,918,510 | 4/1990 | Pfiester | 357/42 |
| 4,920,070 | 4/1990 | Mukai | 437/173 |
| 4,920,401 | 4/1990 | Sakai et al. | 357/59 |
| 4,924,284 | 5/1990 | Beyer et al. | 357/49 |
| 4,927,780 | 5/1990 | Roth et al. | 437/69 |
| 4,929,996 | 5/1990 | Hutter | 357/34 |
| 4,931,409 | 6/1990 | Nakajima et al. | 437/63 |
| 4,933,303 | 6/1990 | Mo | 437/190 |
| 4,935,095 | 6/1990 | Lehrer | 156/644 |
| 4,935,378 | 6/1990 | Mori | 437/43 |
| 4,935,804 | 6/1990 | Ito et al. | 357/71 |
| 4,939,105 | 7/1990 | Langley | 437/228 |
| 4,940,507 | 7/1990 | Harbarger | 156/636 |
| 4,942,137 | 7/1990 | Sivan et al. | 437/63 |
| 4,944,836 | 7/1990 | Beyer et al. | 156/645 |
| 4,946,550 | 8/1990 | Van Laarhoven | 156/643 |
| 4,946,800 | 8/1990 | Li | 437/65 |
| 4,948,742 | 8/1990 | Nishimura et al. | 437/24 |
| 4,950,617 | 8/1990 | Kumagai et al. | 437/41 |
| 4,952,274 | 8/1990 | Abraham | 156/643 |
| 4,952,524 | 8/1990 | Lee et al. | 437/67 |
| 4,952,525 | 8/1990 | van der plas | 437/69 |
| 4,954,214 | 9/1990 | Ho | 156/628 |
| 4,954,458 | 9/1990 | Reid | 437/51 |
| 4,954,459 | 9/1990 | Avanzino et al. | 437/228 |
| 4,956,313 | 9/1990 | Cote et al. | 437/203 |
| 4,956,314 | 9/1990 | Tam et al. | 437/241 |
| 4,957,873 | 9/1990 | Ojha et al. | 437/20 |
| 4,959,325 | 9/1990 | Lee et al. | 437/30 |
| 4,963,951 | 10/1990 | Alder et al. | 357/23.7 |
| 4,966,861 | 10/1990 | Mieno et al. | 437/99 |
| 4,980,019 | 12/1990 | Baerg et al. | 156/643 |
| 5,006,482 | 4/1991 | Kerbaugh et al. | 437/67 |
| 5,015,602 | 5/1991 | Van Der Plas et al. | 437/67 |
| 5,091,289 | 2/1992 | Cronin et al. | 430/312 |
| 5,091,330 | 2/1992 | Cambou et al. | 437/62 |
| 5,094,972 | 3/1992 | Pierce et al. | 437/67 |
| 5,102,822 | 4/1992 | Calligaro | 437/67 |
| 5,104,482 | 4/1992 | Monkowski et al. | 437/236 |
| 5,142,828 | 9/1992 | Curry | 51/281 R |

METHOD OF FORMING LATE ISOLATION WITH POLISHING

CROSS-REFERENCE TO RELATED APPLICATIONS

This is a continuation-in-part of commonly-owned, copending U.S. patent application Ser. No. 07/711,624, entitled TRENCH PLANARIZATION TECHNIQUES and filed on Jun. 6, 1991 by Pasch and Schoenborn, and of commonly-owned, copending U.S. patent application Ser. No. 07/748,853, entitled TECHNIQUES FOR FORMING ISOLATION STRUCTURES and filed on Aug. 22, 1991 by Pasch, both of which are incorporated by reference herein.

TECHNICAL FIELD OF THE INVENTION

The present invention relates to the fabrication of semiconductor devices and, more particularly, to techniques for depositing silicon dioxide ("oxide") in an isolation trench.

BACKGROUND OF THE INVENTION

Electrical isolation of semiconductor integrated transistors from one another can be achieved by laterally (in the plane of the wafer) isolating "active" regions of the device with insulating material. Two techniques are common: 1) selectively oxidizing wafer silicon surrounding the active region by means of Local Oxidation of Silicon (LOCOS), or the like, or 2) depositing insulating material, such as silicon dioxide ("oxide") in a trench (or "bathtub") formed around the active regions.

Regarding the latter technique (trench formation and filling), trenches are typically etched (e.g. plasma etched) into the substrate around the active regions to a depth "d" of from a few hundred Angstroms (Å) to a few microns ($\mu$m). A patterned mask, such as silicon dioxide or silicon nitride, is used for etching the trenches, and an etchant such as fluorine and/or chlorine containing gases, are normally used for etching the substrate selectively (preferentially) to the mask material. Commonly, the resulting trenches are overfilled with silicon dioxide ("oxide"), and excess oxide (that which is not within the trench) is removed, such as by polishing—as disclosed in commonly-owned, copending U.S. patent application Ser. No. 07/711,634.

FIG. 1 shows a semiconductor device 110, including a substrate 112. A trench 114 is formed around a diffusion (active) region 116. The trench is either filled (not shown) by a Chemical Vapor Deposition (CVD) process with an insulating material, such as silicon dioxide ("oxide"), or (as shown) oxide 118 can be thermally formed in the trench. In either case, an oxide isolation structure is formed around the diffusion region.

In either case, the oxide isolation structures are created early on in the device fabrication process, and all subsequent processing is aligned to them. The size and shape of the oxide structure is not solely determined by the requirements for isolation, but can also be significantly affected by the processes used to generate the structures. It is not uncommon for the isolation size to be determined by the ability to create the pattern for the isolation and the subsequent oxide growth process.

The placement of the process used to create the oxide isolation in the processing scheme is significantly determined by the "root (DT)" of the process—that is the heat cycle's time and temperature, required to grow the necessary thermal oxide in an oxygen ambient. The application of this high temperature process can only be accommodated early on in the process, before the introduction (implantation into the diffusion region) of atomic species, e.g., boron or phosphorous, which have large diffusion coefficients. The diffusion of these "fugitive" species at the high temperature of silicon dioxide oxidation has well known detrimental effects on the electrical characteristics of the subsequently created active elements and structures, such as transistors. Among these detrimental effects is that subsequent diffusion (i.e., migration) of the fugitive species must be accounted for, which results in larger and hence slower active elements. Hereinafter, any and all active elements formed in or on the diffusion region will be referred to as "transistors", since they are the most common active element.

As mentioned above, it is also possible to create isolation structures using Chemical Vapor Deposition (CVD) processes to create the silicon dioxide structures. These materials retain most of the positive virtues of the thermally grown oxide isolation structures, but are not typically as free of particles, nor as free of ionic contamination. Nonetheless, they are adequate, especially if a relatively thin thermally grown oxide (500–1000 Å) underlies the CVD oxide. These CVD isolation structures are typically inserted into the transistor device process flow in the same process flow location as the thermally grown oxide—in other words, early on in the process flow (prior to implantation). As such, the isolation structure is determined before the transistor comes into existence.

Returning to FIG. 1, it is known to provide various implants 120$a$ (e.g., source), 120$b$ (e.g., drain) and/or deposited structures 120$c$ (e.g., gate) in and on the diffusion region 116. These implants and structures are shown generically, to indicate a patterned transistor device formed in the diffusion region. A circuit element, such as a transistor, having been created in the diffusion region, and bounded by an oxide isolation structure 118, it is known to provide a subsequent dielectric layer 124, such as CVD Borophosphosilicate glass (BPSG) overlying the transistor structure 120$a$–$c$ and isolation structures 118. The formation of this passivation layer 124 represents an additional (i.e., second) dielectric fabrication step and, significantly, another thermal step which is subsequent to transistor formation.

DISCLOSURE OF THE INVENTION

It is therefore an object of the present invention to provide an improved technique for creating isolation structures.

It is another object of the present invention to provide a technique for creating isolation structures that exhibits lower overall "root (DT)".

It is another object of the present invention to provide a technique for simplifying the process of forming CVD deposited isolation structures in conjunction with forming transistor structures.

It is another object of the present invention to provide a technique for simplifying the process of forming CVD deposited isolation structures in conjunction with forming a passivation layer overlying a transistor structure.

It is a further object of the present invention to provide a technique for forming transistor structures that is relatively unconstrained by previously formed isolation structures.

It is a further object of the present invention to provide a technique for forming isolation structures that is relatively more flexible than would otherwise be the case if formed prior to formation of a transistor structure.

It is a further object of the present invention to provide a technique for forming isolation structures that allows for the fabrication of smaller, faster transistor structures.

According to the invention, trenches are formed around (adjacent) diffusion regions in a substrate. Prior to formation of isolation structures in the trenches, a fully patterned transistor structure is created in the diffusion region. Isolation and passivation structures are formed in a single step, after transistor fabrication, by CVD deposition of a layer of oxide or BPSG over the substrate. This is what is meant by "late isolation". The passivation/isolation layer overfills trenches formed for isolation and covers the patterned transistor device. The layer is subsequently planarized by chemi-mechanical (also known as chem-mech) polishing, or other means.

According to an aspect of the invention, the passivation/isolation layer is planarized by chem-mech polishing.

With only one deposition step involved, to form both isolation structures and a passivation layer, there is significantly less strain on the thermal budget. As a further result of less thermal strain, there is less migration of the diffused species of the transistor structure. Hence, smaller and consequently faster transistor structures can be created with the late isolation process.

Thus, the invention not only allows for beneficially lower temperatures in the fabrication process, but also allows for the use of trench isolation techniques, which are beneficial for device density.

Other objects, features and advantages of the invention will become apparent in light of the following description thereof.

It should be understood that while only one semiconductor structure is shown, the present invention is applicable to a plurality of such structures on a semiconductor device.

DETAILED DESCRIPTION OF THE INVENTION

Figure 1:
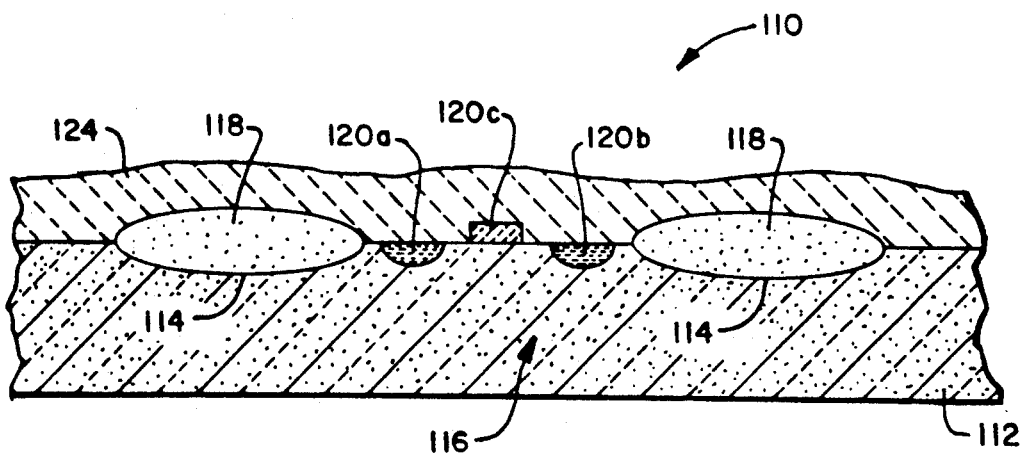
FIG. 1 is a cross-sectional view of a prior art semiconductor structure.

FIG. 1 shows a semiconductor isolation structure and has been discussed hereinabove.

Figure 2A:
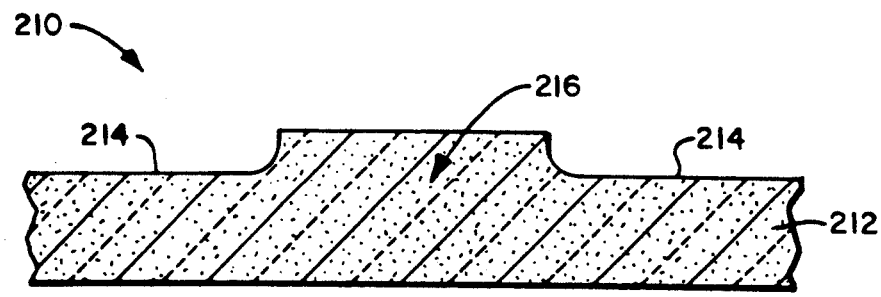
FIG. 2A is a cross-sectional view of an inchoate semiconductor structure, formed according to the technique of the present invention, prior to forming a transistor structure.

FIG. 2A shows an in-process (inchoate) semiconductor structure 210, according to the present invention.

The structure 210 includes a substrate 212. Trenches 214 are formed in the substrate 212, according to known techniques, and surround areas 216 into which fugitive species (e.g., boron and phosphorous) will be implanted to form an active element, such as a transistor structure. It is also known, but not illustrated to form active circuit elements atop the region 216, which is referred to hereinafter as the "diffusion" region.

Figure 2B:
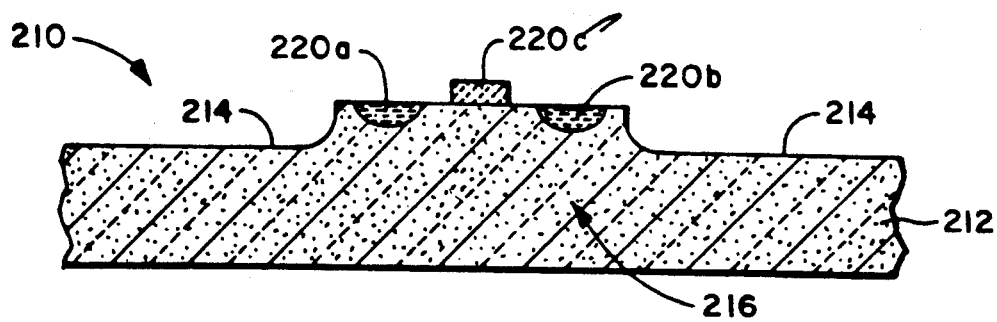
FIG. 2B is a cross-sectional view of the semiconductor structure of FIG. 2A, at a later stage in fabrication, after a transistor formation, and prior to applying CVD oxide, according to the present invention.

FIG. 2B shows the semiconductor structure 210 of FIG. 2A at a later stage of fabrication. For simplicity, active elements 220a, 220b and 220c are shown, and correspond to elements 120a, 120b and 120c of FIG. 1—in other words, a generic transistor device formed in the diffusion region 216. This is intended to represent any of a virtually unlimited number of fully patterned transistor devices which may be formed in the diffusion region.

Figure 2C:
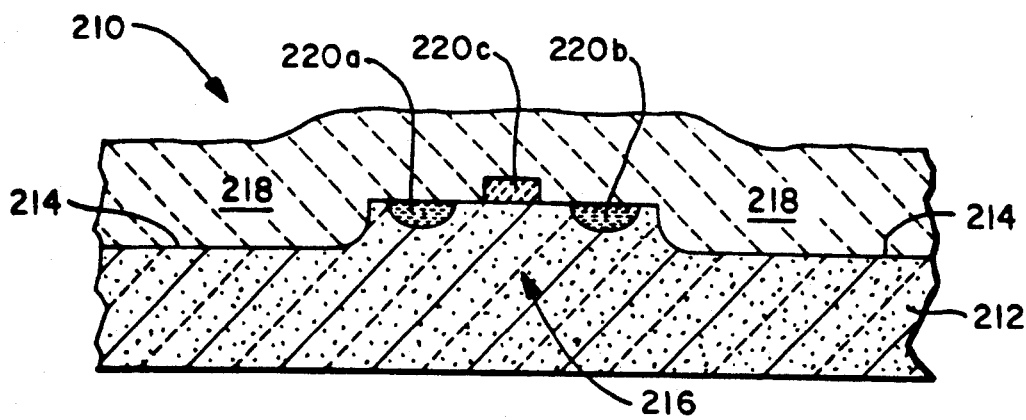
FIG. 2C is a cross-sectional view of the semiconductor structure of FIG. 2B, after deposition of CVD oxide, according to the present invention.
Figure 2D:
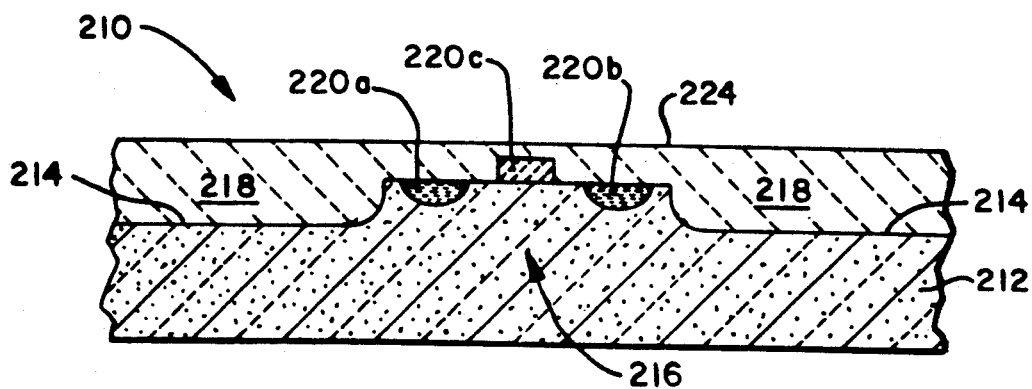
FIG. 2D is a cross-sectional view of the semiconductor structure of FIG. 2C, after planarization of the CVD oxide.

FIG. 2C shows the semiconductor structure 210 of FIG. 2B at a later stage of fabrication. Herein, it is seen that an overlying dielectric layer 224 has been deposited over the entire wafer, overfilling the trenches 214 and covering the diffusion region (i.e., overlying the transistor device). The layer is an insulating layer, and is preferably a CVD deposition of a material selected from the group of oxide or BPSG. Evidently, the layer 224 is non-planar, tending to conform to the topography of the wafer prior to its deposition. The deposition of an overlying passivation layer is known, and is known to require long and hot CVD coating reflow cycles (e.g., in the case of BPSG) to achieve planarity.

The single deposited layer 124 serves two functions. By filling the trenches 214, it forms an isolation structure 218 surrounding the diffusion region 216, and by covering the diffusion region, it forms a passivation layer. Significantly, these two structures (isolation and passivation) are formed in a single step.

At this stage, it is desirable to planarize the layer 224, for subsequent formation of vias and overlying metal interconnect layers (not shown). Chem-mech polishing is employed, which allows an improvement in the planarity of the device structure which is currently unavailable without prohibitively long and hot CVD coating reflow cycles. That there would only be one polish step necessary to accomplish a significantly improved planarization, because of the late deposition of the CVD device isolation plus device passivation plus device planarization oxide coating is both novel and non-obvious.

Chem-mech polishing is described in U.S. Pat. Nos. 4,671,851, 4,910,155 and 4,944,836, incorporated by reference herein. It is also possible that simple mechanical lapping techniques could be employed for polishing the insulating layer 124, such as described in U.S. Pat. No. 4,940,507, incorporated by reference herein.

Further, the techniques for controlling chem-mech polishing, in general, are described in the aforementioned U.S. patent application Ser. No. 07/711,624, entitled TRENCH PLANARIZATION TECHNIQUES and filed on Jun. 6, 1991 by Pasch and Schoenborn, incorporated by reference herein. Yet further, techniques for applying chem-mech polishing to the fabrication of isolation structures are described in commonly-owned, copending U.S. patent application Ser. No. 07/748,853, entitled TECHNIQUES FOR FORMING ISOLATION STRUCTURES and filed on Aug. 22, 1991 by Pasch, incorporated by reference herein.

A major benefit of the present invention derives from the realization that by performing the CVD coating process for device isolation after the transistor fabrication process, and by taking advantage of recent developments in the technology of polishing dielectric materials for subsequent planarization of the deposited dielectric, then surprising benefits are obtained in the device fabrication process. These include a lower overall "root (DT)" process, with its inevitable improvement in precise device construction which allows for smaller and faster transistors.

The simplification of the process by introducing CVD deposition after transistor device fabrication means that instead of two dielectric fabrication steps that are now required for the isolation structure and the subsequent BPSG/CVD coating that is put onto the wafer after the complete patterning of the transistor, there is now only one deposition process, which is the one after the transistor is patterned.

Normal temperatures for growth of field (isolation) oxide (see FIG. 1) are in on the order of 1000° C. Normal temperatures for deposition of a BPSG passivation layer or the oxide passivation layer (as disclosed herein) are (oxided) at ≦900° C., typically 800° C., which is much more moderate. Evidently, by using the technique of the present invention, a significant amount of "leverage" is gained on the thermal budget for transistor fabrication. As mentioned hereinabove, this will allow for the construction of smaller, hence faster, transistor devices. Furthermore, as a general proposition, the application of heat to an already formed transistor structure is undesirable, especially in the production of radiation-resistant devices.

What is claimed is:

1. A method of forming isolated transistor structures in diffusion regions on a substrate, comprising in sequence:

forming a trench in a substrate around a diffusion region;

after forming the trench, forming a transistor structure in the diffusion region; and after forming the transistor structure, depositing an insulating layer onto the substrate, over-filling the trench and covering the diffusion region, thereby forming in a single step an isolation structure around the transistor structure and a passivation layer over the transistor structure, the isolation structure being integral with the passivation layer.

2. A method according to claim 1, wherein:
    the insulating layer is oxide.

3. A method according to claim 1, wherein:
    the insulating layer is BPSG.

4. A method according to claim 1, further comprising:

after depositing the insulation layer, polishing back the insulating layer until it is planar.

* * * * *